United States Patent
Gardner et al.

(10) Patent No.: US 6,172,407 B1
(45) Date of Patent: Jan. 9, 2001

(54) SOURCE/DRAIN AND LIGHTLY DOPED DRAIN FORMATION AT POST INTERLEVEL DIELECTRIC ISOLATION WITH HIGH-K GATE ELECTRODE DESIGN

(75) Inventors: Mark I. Gardner, Cedar Park; Mark C. Gilmer, Austin, both of TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/061,552

(22) Filed: Apr. 16, 1998

(51) Int. Cl.$^7$ ..................................................... H01L 29/72
(52) U.S. Cl. ...................... 257/410; 257/412; 257/413; 257/513; 257/514; 257/754
(58) Field of Search ................................. 257/410, 412, 257/413, 513, 514, 754

(56) References Cited

U.S. PATENT DOCUMENTS

| | | |
|---|---|---|
| 5,120,668 | 6/1992 | Hsu et al. . |
| 5,200,352 | 4/1993 | Pfiester . |
| 5,374,574 | 12/1994 | Kwon . |
| 5,374,575 | 12/1994 | Kim et al. . |
| 5,376,578 | 12/1994 | Hsu et al. . |
| 5,534,447 * | 7/1996 | Hong ..................................... 257/344 |
| 5,597,752 | 1/1997 | Niwa . |

* cited by examiner

Primary Examiner—Edward Wojchiechowicz
(74) Attorney, Agent, or Firm—Kevin L. Daffer; Conley, Rose & Tayon

(57) ABSTRACT

An integrated circuit fabrication process is provided in which a gate electrode including a gate dielectric and a gate conductor is formed upon a semiconductor substrate. Preferably, the gate dielectric has a dielectric constant greater than the dielectric constant of silicon dioxide. In an embodiment, sidewall spacers are formed laterally adjacent opposed sidewall surfaces of the gate electrode. An interlevel dielectric is then formed above the semiconductor substrate and selectively removed from above active regions of the semiconductor substrate to form an opening. Source and drain implant areas are formed self-aligned with the opposed sidewall spacers. A metal silicide layer may be formed across upper surfaces of the gate conductor and source and drain areas, a second interlevel dielectric deposited in the opening, and contacts formed through the second interlevel dielectric to the metal silicide. In an alternative embodiment, the gate dielectric may be formed sufficiently thick such that sidewall spacers are unnecessary to prevent silicide bridging between the gate conductor and the junction regions. In another alternative embodiment, the lightly doped drain implant areas may be formed self-aligned to the gate electrode prior to spacer formation.

14 Claims, 5 Drawing Sheets

SOURCE/DRAIN AND LIGHTLY DOPED DRAIN FORMATION AT POST INTERLEVEL DIELECTRIC ISOLATION WITH HIGH-K GATE ELECTRODE DESIGN

BACKGROUND OF THE INVENTION

1. Field of the Invention

This invention relates to integrated circuit fabrication and, more particularly, to a method for forming source and drain implant areas and salicidation after deposition of an interlevel dielectric.

2. Description of the Related Art

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. After implantation and subsequent diffusion of the junctions, however, the actual distance between junctions becomes less than the physical channel length and is often referred to as the effective channel length. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Accordingly, reducing L, and hence $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies).

Minimizing L also improves the speed of integrated circuits including a large number of individual transistors because the larger drain current associated with a short channel length can drive the adjoining transistors into saturation more quickly. Minimizing L is, therefore, desirable from a device operation standpoint. In addition, minimizing L is desirable from a manufacturing perspective, because a smaller area of silicon is required to manufacture a transistor having a smaller length.

As the gate conductor decreases in lateral dimension, the contact resistance increases, as does the sheet resistivity of the shallow junctions of the source and drain regions. To reduce these resistance values, along with reducing the interconnect resistance of the polysilicon gate conductors, self-aligned silicide ("salicide") technology can be used. Using the salicide technique, a refractory metal is deposited over an MOS structure. The metal is then heated and reacted with the exposed silicon of the source and drain areas and the exposed polysilicon areas of the gate to form a metal silicide. Dielectric spacers are typically formed adjacent the sidewalls of the polysilicon gate conductor from, e.g., silicon dioxide. Because the spacers substantially inhibit formation of the silicide, the spacers prevent the source and drain areas from becoming electrically connected to the gate.

The difficulty in forming a metal silicide increases as the gate width decreases. Refractory metal is usually deposited as a conformal layer across the semiconductor topography. The thickness of the metal layer may be insufficient on very narrow gates to allow adequate silicide formation (the so-called "narrow poly effect"). If the thickness of the deposited metal is increased, however, the thickness of the silicide formed on the source and drain regions may exceed the depth of the junction, leading to electrical shorting of the device, or "junction spiking".

Other features of MOS transistors have also grown smaller as the gate length has decreased. For example, the thickness of the gate dielectric is made as small as possible, because the drive current in MOSFETs increases with decreasing gate dielectric thickness. In addition, thin gate dielectrics control short channel effects by permitting the gate to retain control of the channel charge. Typically, the gate dielectric is a layer of silicon dioxide ("oxide"). The use of very thin gate oxides may present several potential problems, however. It is at present difficult to grow very thin gate dielectric oxides precisely and uniformly across a semiconductor substrate and from wafer to wafer. The gate oxide must also be resistant to breakdown and hot-carrier damage. In p-channel devices, the gate oxide needs to be resistant to penetration by boron at the processing temperatures used after gate doping.

It would therefore be desirable to derive a method for fabricating a transistor in which a salicide can be formed across a narrow gate without the risk of junction spiking. It would further be desirable to form a narrow-gate-width device without the disadvantages associated with thin gate dielectrics.

SUMMARY OF THE INVENTION

The problems outlined above are in large part solved by the technique hereof for fabricating a transistor in which source and drain implant areas and metal silicides are formed following deposition of an interlevel dielectric. In one embodiment, a layer of a high-K dielectric material is formed upon a semiconductor substrate. For purposes of this application, a "high-K dielectric material" is a material having a dielectric constant K greater than approximately 3.8, the K value of silicon dioxide. Examples of high-K dielectrics include barium strontium titanate, lead lanthanum zirconate titanate, barium zirconate titanate, cerium oxide, tin oxide, and tantalum oxide. The high-K dielectric layer may be formed using, e.g., chemical vapor deposition ("CVD") or spin-on deposition.

A conductive gate layer is subsequently deposited across the high-K dielectric layer. The conductive gate layer is preferably polysilicon that has been chemically-vapor deposited ("CVD") from, e.g., a silane source. However, the conductive gate layer may include other semiconductive or conductive materials. Following formation of the dielectric and conductive gate layers, a gate electrode having opposed sidewall surfaces may be defined by etching portions of the conductive gate layer and the dielectric layer not covered by a patterned photoresist layer using, e.g., a directional plasma etch technique.

In an embodiment of the present invention in which the high-K gate dielectric is deposited to a thickness of substantially greater than approximately 500 angstroms, an interlevel dielectric material may be deposited across the semiconductor topography following formation of the gate structure and an upper surface of the interlevel dielectric polished to form a substantially planar upper surface. For purposes of this application, an "interlevel dielectric" is a dielectric material which exists in a plane above a semiconductor substrate and typically functions to electrically isolate two conductive layers (e.g., a gate conductor and a level of interconnect). An interlevel dielectric is distinguishable from a field dielectric. A "field dielectric" or "isolation region" is typically formed within, rather than upon, a semiconductor substrate and functions to electrically isolate active regions of the semiconductor substrate from one another. The interlevel dielectric may include, e.g., silicon dioxide deposited from a TEOS source. A layer of photoresist may then be deposited across the upper surface of the interlevel dielectric. Portions of the photoresist above the active regions of the semiconductor substrate may be patterned using optical lithography. Interlevel dielectric material may then be selectively removed to form an opening exposing the gate structure and the source and drain regions. Following formation of the opening, the photoresist may be stripped from the upper surface of remaining portions of the interlevel dielectric. Alternatively, the photoresist may be retained upon the interlevel dielectric and removed at a subsequent processing step.

An implant impurity distribution may then be forwarded into the semiconductor substrate, with the gate dielectric and the gate conductor serving as implant masks to block implantation of impurity ions into the channel region underlying the gate. Heavily doped source and drain regions are preferably formed self-aligned with sidewall surfaces of the gate conductor. In an embodiment, a rapid thermal anneal may be used to drive the implanted ions into the channel regions beneath the gate.

Following formation of the source and drain implant areas, a refractory metal (e.g., titanium or cobalt) may be deposited across upper surfaces of the source and drain regions, the gate conductor, and the interlevel dielectric. Preferably, the refractory metal is deposited to a depth sufficient to fill the trench in which the gate structure resides. In an embodiment, deposited metal may be removed using, e.g., a chemical-mechanical polish such that an upper surface of the remaining metal is substantially coplanar with the upper surface of the interlevel dielectric and such that the upper surface of the interlevel dielectric is essentially free of deposited metal. Alternatively, the refractory metal may be deposited without a subsequent polish step. The semiconductor substrate may then be heated to react the metal with the source and drain regions and the conductive gate structure to form silicide regions within the source and drain region and within the conductive gate structure. The sheet resistivity of the silicide thereby formed is less than the corresponding sheet resistance of the non-silicided source and drain regions or non-silicided conductive gate structure.

Unreacted metal may be removed from above the gate structure and the source and drain region (and, if no polishing step was performed, from above the interlevel dielectric). Interlevel dielectric ("ILD") material may then be deposited into the trench containing the gate structure. The upper surface of the newly deposited material may be planarized to a level commensurate with the upper surface of the previously deposited ILD. Following planarization, contact vias may be formed by removing ILD from areas immediately above the silicided source and drain implant regions and the silicided gate conductor. Conductive material may then be deposited in the vias to form conductive plugs.

In an embodiment of the present invention in which the high-K gate dielectric is formed to a thickness substantially less than approximately 500 angstroms, sidewall spacers may be formed adjacent the gate structure prior to the source and drain impurity implant. The presence of the spacers prevents conductive material from being deposited in regions directly laterally adjacent to the gate conductor, where the conductive material could render the transistor inoperable. To form the spacers, a spacer material may be deposited across the semiconductor topography. The spacer material suitably includes a dielectric material such as silicon dioxide, silicon nitride, or silicon oxynitride. The spacer material may then be anisotropically etched such that it is removed from horizontally oriented surfaces at a faster rate than from vertically oriented surfaces. The duration of the anisotropic etch is preferably terminated after the spacer material is removed from all horizontally oriented surfaces but before the spacer material is completely removed from the vertical sidewall surface. The lateral thickness of the resulting sidewall spacer that is retained upon the sidewall surface of the polysilicon layer is thus dictated by the duration of the anisotropic etch step. In a preferred embodiment, the sidewall spacers have a lateral thickness substantially between approximately 50 angstroms and approximately 200 angstroms.

In yet another alternative embodiment, sidewall spacers are formed to a lateral thickness substantially between approximately 200 angstroms and approximately 500 angstroms. As such, an additional ion implant may be performed prior to spacer formation to form lightly doped drain implant regions self-aligned with the sidewalls of the gate structure. Following spacer formation, the more heavily doped source and drain implant regions may be formed as previously described.

BRIEF DESCRIPTION OF THE DRAWINGS

Other objects and advantages of the invention will become apparent upon reading the following detailed description and upon reference to the accompanying drawings in which.

Figure 1:
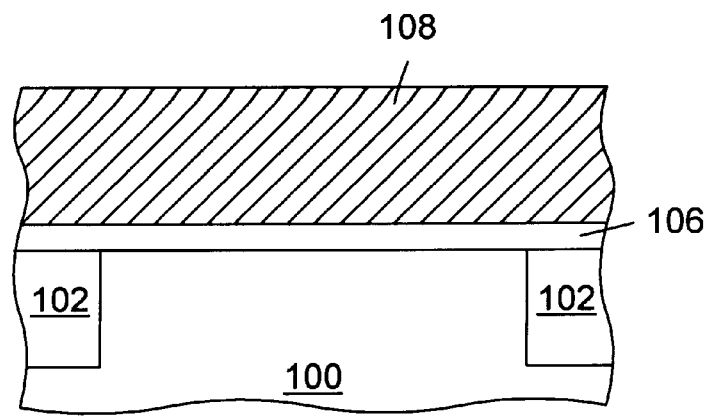
FIG. 1 is a partial cross-sectional view of a semiconductor topography having a conductive gate layer formed a dielectric distance above a semiconductor substrate and a pair of dielectric isolation regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 illustrates a method for forming a transistor according to the present invention, in which a dielectric material 106 having a dielectric constant K greater than approximately 3.8 (i.e., a "high-K dielectric," with a K value greater than the K value of silicon dioxide) has been formed upon semiconductor substrate 100. Examples of high-K dielectrics include barium strontium titanate, lead lanthanum zirconate titanate, barium zirconate titanate, cerium oxide, tin oxide, and tantalum oxide. High-K dielectric layer 106 may be formed using, e.g., chemical vapor deposition ("CVD") or spin-on deposition. The thickness of dielectric layer 106 may vary, depending somewhat on the K value of the dielectric and the desired threshold voltage of the ensuing transistor. For example, a 200-angstrom-thick layer of a dielectric material with a K value of 38 will have electrical properties approximately equivalent to the electrical properties of a silicon dioxide layer 20 angstroms thick. Semiconductor substrate 100 may comprise single crystalline silicon and may include dielectric isolation regions 102 arranged a spaced distance apart for dielectrically isolating ensuing active areas of the semiconductor substrate. Preferably, substrate 100 is slightly doped with n-type or p-type impurities.

The use of a high-K dielectric material to form the gate dielectric has several potential advantages. Silicon dioxide is frequently used as the gate dielectric material. A layer of metal silicide may form on the silicon dioxide gate dielectric sidewalls simultaneously with formation of the silicide upon the gate conductor and the source and drain regions of the semiconductor substrate. Use of a non-silicon-based gate dielectric material prevents "bridging" (formation of an electrical contact) between the gate conductor and the junction regions. Even in the absence of silicon in the gate dielectric, however, bridging can occur due to electromigration of conductive material from gate conductor toward the junction regions and vice versa. If the gate dielectric is sufficiently thick, the risk of bridging due to electromigration is minimized. In addition, dielectric spacers, which are typically formed adjacent the sidewalls of the gate electrode in order to prevent bridging, are then rendered unnecessary when the gate dielectric thickness exceeds about 500 angstroms.

A conductive gate layer 108 is preferably deposited across dielectric layer 106. Conductive gate layer 108 is preferably polysilicon which has been chemically-vapor deposited ("CVD") from, e.g., a silane source. The composition of conductive gate layer 108, however, is not limited to polysilicon; the conductive gate layer may include other semiconductive or conductive materials. Following formation of the dielectric and conductive gate layers, opposed sidewall surfaces may be defined by etching portions of the conductive gate layer and the dielectric layer not covered by a patterned photoresist layer using, e.g., a directional plasma etch technique.

Figure 2:
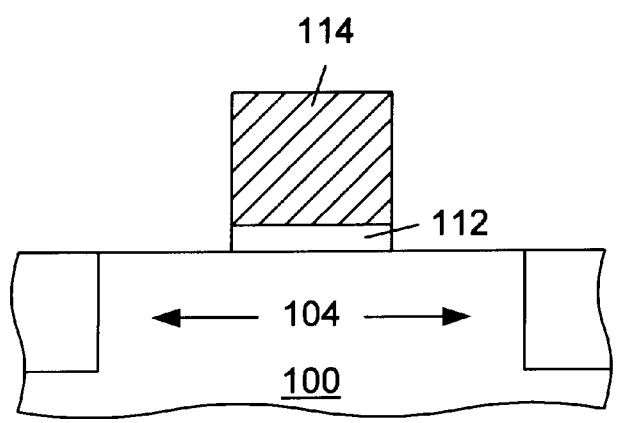
FIG. 2 is a partial cross-sectional view of the semiconductor topography according to a processing step subsequent to FIG. 1, in which the conductive gate layer is patterned to form a gate conductor aligned over a channel region of the semiconductor substrate.

As depicted in FIG. 2, the gate conductor and the dielectric layer have been selectively etched to form transistor gate dielectric 112 and gate conductor 114. A suitable process for forming the gate dielectric and gate conductor includes a conventional photolithography process in which a photoresist film is deposited over the conductive gate layer 108. The photoresist film is then photolithographically patterned to produce a patterned photoresist film that includes a photoresist structure aligned over channel region 104 of semiconductor substrate 100. The exposed portions of conductive gate layer 108 are then removed with a conventional plasma etch process that is well known in the field of semiconductor processing. The patterned photoresist film is then removed from the semiconductor substrate with a photoresist strip process.

Figure 3:
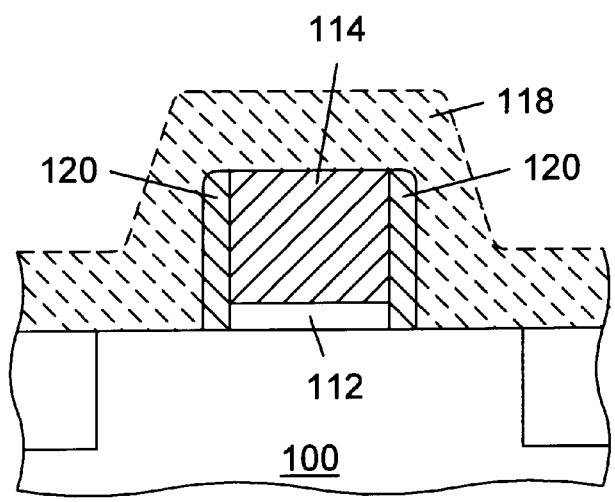
FIG. 3 is a partial cross-sectional view of the semiconductor topography according to a processing step subsequent to FIG. 2, in which sidewall spacers are formed adjacent exposed sidewalls of the gate conductor to form a conductive gate structure.

In an embodiment depicted in FIG. 3, dielectric spacers 120 are formed on the sidewalls of the gate structure. Dielectric material 118 (shown in phantom) is deposited across exposed portions of gate conductor 114, gate dielectric 112, and semiconductor substrate 100. Suitable dielectric materials for spacer formation include silicon nitride, silicon oxynitride, and silicon dioxide. An anisotropic etch is then used to preferentially remove dielectric material 118 from horizontal surfaces of the semiconductor topography while retaining the dielectric material on vertical surfaces. The retained material forms spacers 120 adjacent sidewall surfaces of the gate structure.

Figure 4:
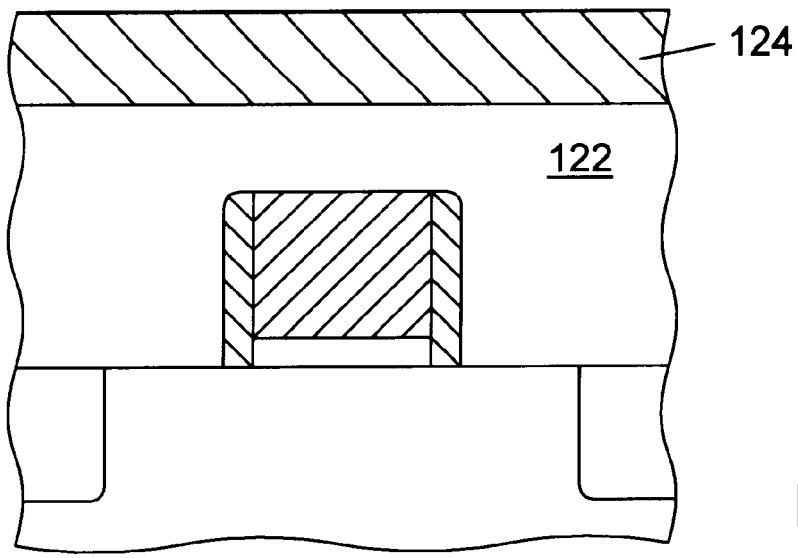
FIG. 4 is a partial cross-sectional view of the semiconductor topography according to a processing step subsequent to FIG. 3, in which layers of an interlevel dielectric and a photoresist are formed across the semiconductor topography.
Figure 5:
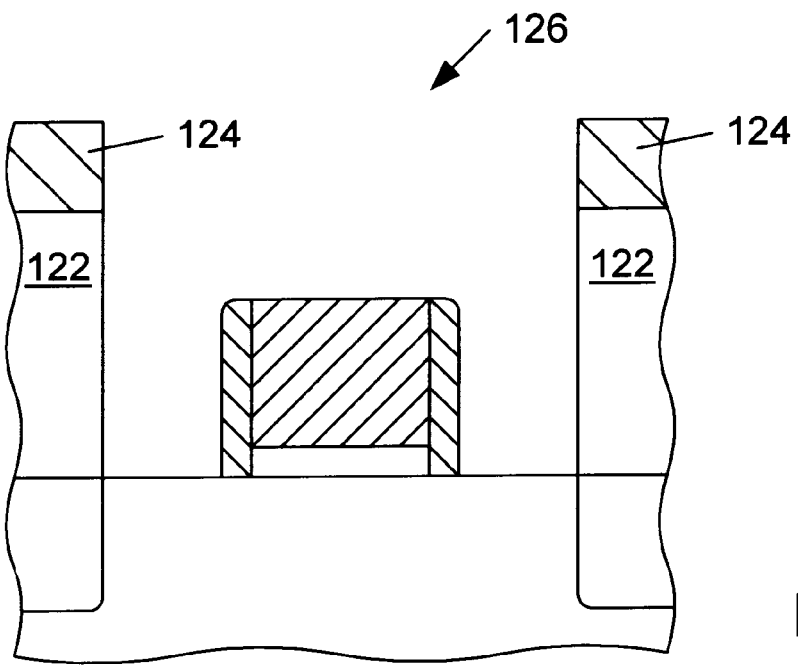
FIG. 5 is a partial cross-sectional view of the semiconductor topography according to a processing step subsequent to FIG. 4, in which an opening is formed over the active region of the semiconductor substrate.

Following formation of the spacers, an interlevel dielectric ("ILD") 122 may be deposited across the semiconductor topography. An upper surface of ILD 122 may be planarized using, e.g., chemical-mechanical polish, as depicted in FIG. 4. Photoresist 124 may be deposited across the planarized upper surface of ILD 122. Following patterning of photoresist using optical lithography, as is well known in the art, portions of photoresist not exposed to light may be removed along with the underlying interlevel dielectric material using, e.g., a dry plasma etch to form opening 126 above the active region of the semiconductor substrate, as shown in FIG. 5. Preferably, ILD 122 is of different composition from the dielectric material used to form spacers 120 such that the ILD will be preferentially removed while the spacers are retained when opening 126 is formed. For example, if spacers 120 are formed from silicon dioxide, ILD 122 may be a spin-on deposited material or a phosphosilicate glass. If the ILD is silicon dioxide, the spacers may be formed of, e.g., silicon nitride. Following formation of opening 126, retained portions of photoresist 124 may be stripped from the upper surface of interlevel dielectric 122. Alternatively, the photoresist may be retained upon the interlevel dielectric and removed at a subsequent processing step.

Figure 6:
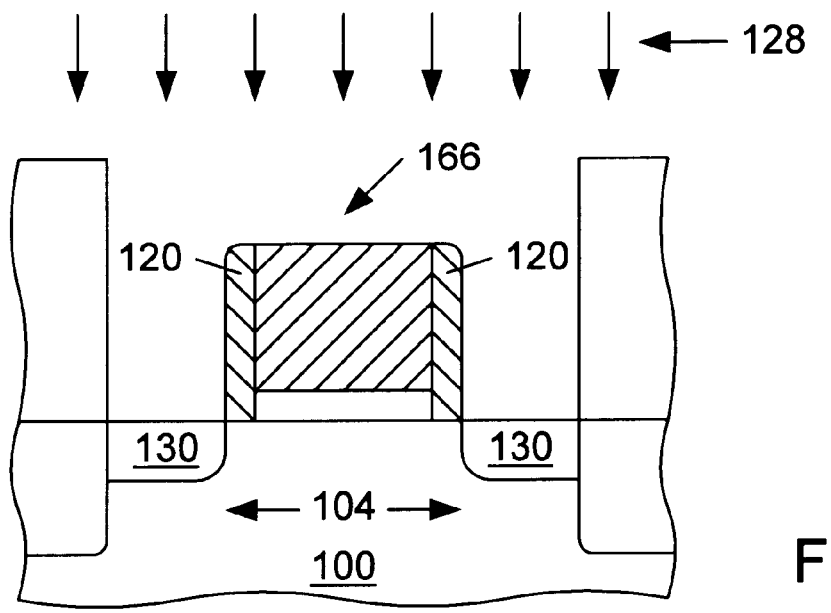
FIG. 6 is a partial cross-sectional view of the semiconductor topography according to a step subsequent to FIG. 5, wherein source and drain implant areas are defined a spaced distance from the channel area according to the sidewall spacers.

Implant impurity distribution 128 may then be forwarded into selected regions of semiconductor substrate 100 (FIG. 6). Gate structure 166 serves as an implant mask to block implantation of impurity ions into channel region 104 underlying the gate. Heavily doped source and drain regions 130 are formed in semiconductor substrate 100 self-aligned with sidewall surfaces of spacers 120. In an embodiment, a rapid thermal anneal may be used to drive the implanted ions into the channel region 104 beneath the gate.

Figure 7:
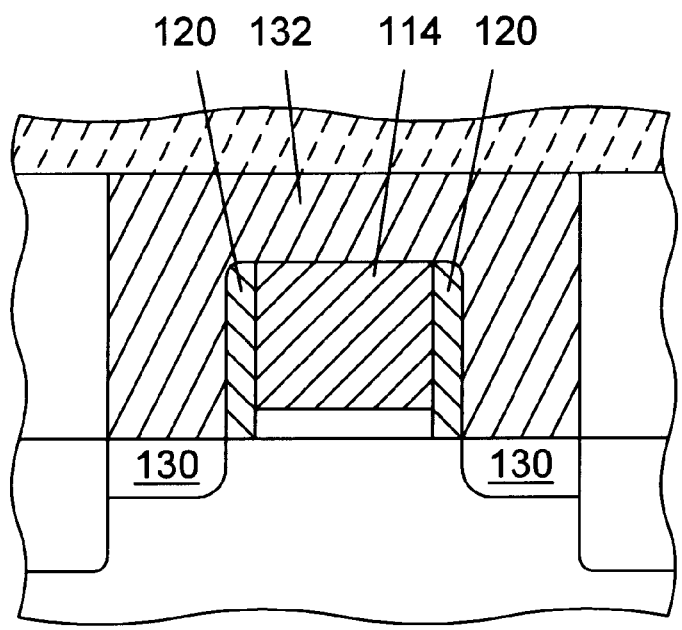
FIG. 7 is a partial cross-sectional view of the semiconductor topography according to a processing step subsequent to FIG. 6, in which a refractory metal is deposited within the opening.

Turning now to FIG. 7, a refractory metal (e.g., titanium or cobalt) may be formed across upper surfaces of source and drain regions 130, gate conductor 114, and spacers 120. Refractory metal 132 may be sputter deposited from a metal target such that it travels in a direction substantially perpendicular to horizontally oriented features. In an embodiment, refractory metal 132 is deposited at least to a depth sufficient to fill opening 126. The thickness of refractory metal 132 is therefore greater over source and drain implant areas 130 than over gate conductor 114. As such, sufficient metal may be deposited upon gate conductor 114 such that narrow poly effects are avoided and a metal silicide layer is formed. At the same time, the increased thickness of metal over source and drain implant areas 130 preferably somewhat inhibits silicide formation, such that a shallower silicide layer is formed without completely consuming the doped portion of the semiconductor substrate.

In an embodiment, refractory metal 132 may be deposited to an elevational level above the elevational level of the upper surface of interlevel dielectric 122 and the upper surface of the refractory metal may be planarized using, e.g., CMP such that the upper surface of the refractory metal is substantially coplanar with the upper surface of the interlevel dielectric. Removed refractory metal is depicted in phantom in FIG. 7. Alternatively, the refractory metal may be deposited without a subsequent polish step.

Figure 8:
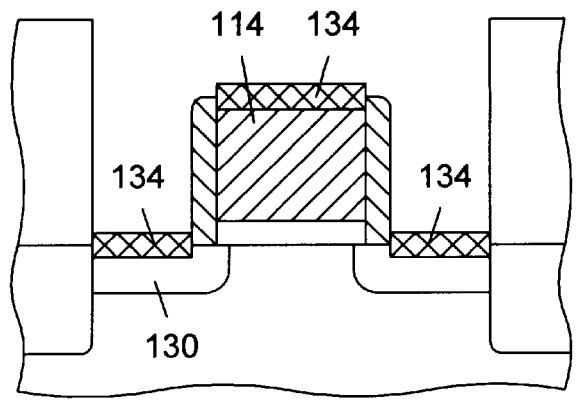
FIG. 8 is a partial cross-sectional view of the semiconductor topography according to a step subsequent to FIG. 7, wherein a metal silicide is formed on the gate conductor and source and drain upper surfaces to enhance interlevel conductivity thereto.

The deposited refractory metal may be exposed to a form of radiation capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP"). The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of polysilicon gate conductor 114 and source and drain areas 130. Unreacted refractory metal which remains may be etched away using, e.g., a wet etch highly selective to the metal. The resulting metal silicide 134 (FIG. 8) has a relatively low resistivity and serves as a self-aligned contact region across source and drain areas 130 and gate conductor 114.

Figure 9:
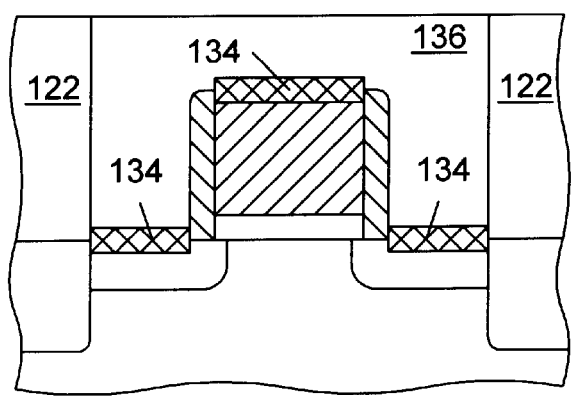
FIG. 9 is a partial cross-sectional view of the semiconductor topography according to a processing step subsequent to FIG. 8, in which a second interlevel dielectric is deposited in the opening.
Figure 10:
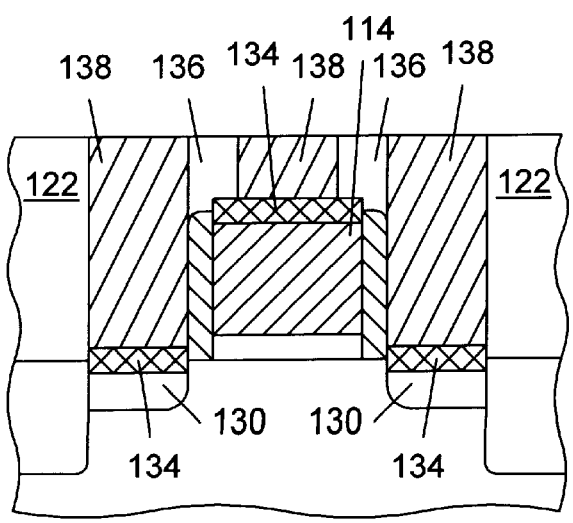
FIG. 10 is a partial cross-sectional view according to a processing step subsequent to FIG. 9, in which contacts are formed to the gate conductor and the source and drain implant areas.

Following removal of unreacted refractory metal, the resulting opening may be filled with an interlevel dielectric material 136 and an upper surface of the fill material planarized to an elevational level substantially coplanar with the upper surface of interlevel dielectric 122 (FIG. 9). Preferably, interlevel dielectric 136 is the same material as interlevel dielectric 122. Contact vias may then be formed in interlevel dielectric 136 in areas above silicide layers 134 by, e.g., patterning and selective etching using a photoresist. The vias may then be filled with a conductor to form contacts 138 with gate conductor 114 and source and drain implant regions 130, as depicted in FIG. 10. In an embodiment, upper surfaces of contacts 138 may be planarized to an elevational level substantially coplanar with upper surfaces of interlevel dielectrics 122 and 136.

Figure 11:
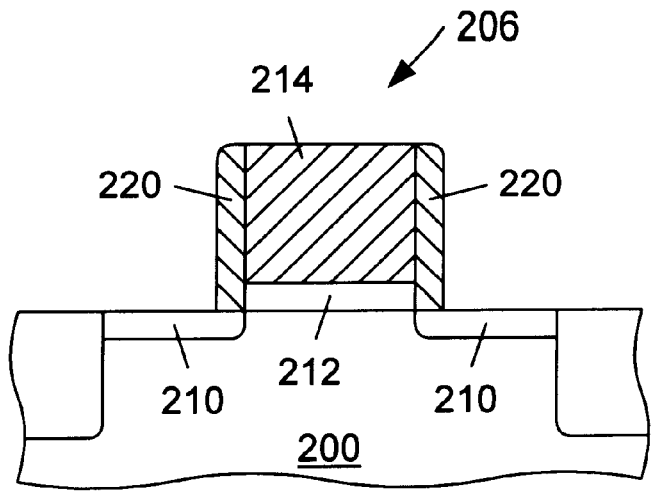
FIG. 11 is an alternative conductive gate structure having thick sidewall spacers and formed prior to the processing steps depicted in FIGS. 4–10.

In an alternative embodiment to the transistor structure 166 (FIG. 6), transistor 206 comprising gate dielectric 212, gate conductor 214, and sidewall spacers 220 may be formed upon semiconductor substrate 200, as shown in FIG. 11. As depicted, sidewall spacers 220 have a lateral thickness substantially greater than approximately 200 angstroms and preferably between approximately 200 angstroms and approximately 500 angstroms. Due to the thickness of sidewall spacers 220, low-mobility ions such as arsenic implanted into subsequently formed source and drain implant areas may not diffuse sufficiently through regions of semiconductor substrate 200 underlying spacers 220 to counteract short channel effects and hot carrier effects. As such, lightly doped drain implant areas 210 may be formed self-aligned with sidewall surfaces of gate conductor 214 prior to formation of spacers 220. Processing steps following spacer formation may be similar to the steps depicted in FIGS. 4–10.

Figure 12:
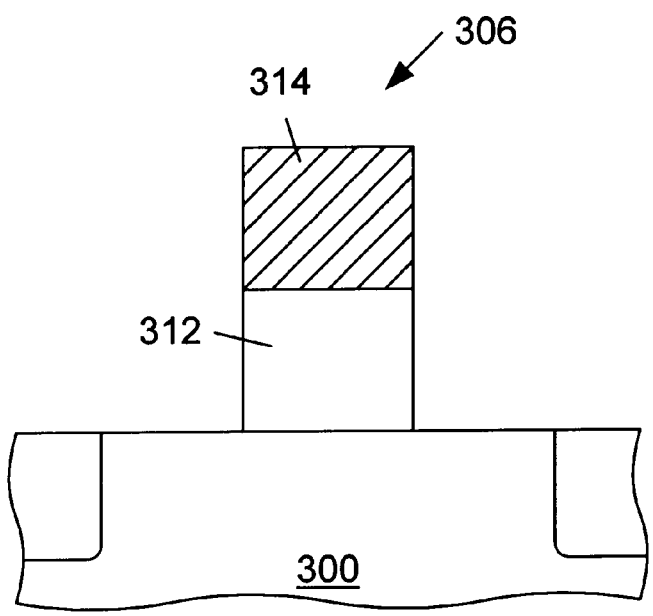
FIG. 12 is an alternative conductive gate structure lacking sidewall spacers and formed prior to the processing steps depicted in FIGS. 4–10.

In yet another alternative embodiment, transistor 306 comprising gate dielectric 312 and gate conductor 314 may be formed upon semiconductor substrate 300, as shown in FIG. 12. Gate dielectric 312 preferably has a thickness substantially greater than approximately 500 angstroms. Sufficient separation preferably exists between gate conductor 312 and semiconductor substrate 300 to prevent metal silicide bridging and shorting of the transistor, even in the absence of sidewall spacers. As such, no spacers are formed adjacent sidewall surfaces of gate conductor 306. Processing steps following formation of conductive gate structure 306 may be similar to the steps depicted in FIGS. 4–10.

It will be appreciated to those skilled in the art having the benefit of this disclosure that this invention is believed to provide a method for forming transistors of small geometries. Further modifications and alternative embodiments of various aspects of the invention will be apparent to those skilled in the art in view of this description. For example, in a CMOS embodiment in which an NMOSFET (implanted with, e.g., lower-diffusivity arsenic or phosphorous) and a PMOSFET (implanted with, e.g., higher-diffusivity boron) are formed with sidewall spacers of approximately equal lateral thicknesses, the NMOSFET may be formed prior to the PMOSFET and annealed at a higher temperature. Alternatively, if the NMOSFET and PMOSFET implant anneals are to be performed simultaneously or at approximately the same temperature, the NMOSFET may be formed with narrower sidewall spacers than are formed in the PMOSFET. It is intended that the following claims be interpreted to embrace all such modifications and changes and, accordingly, the specification and drawings are to be regarded in an illustrative rather than a restrictive sense.

What is claimed is:

1. A transistor arranged within an opening in an interlevel dielectric, the transistor comprising:

a gate conductor arranged above a channel area within a semiconductor substrate;

a gate dielectric interposed between the gate conductor and the channel area, the gate dielectric having a dielectric constant greater than approximately 3.8; and a source/drain region configured within the semiconductor substrate laterally between a sidewall surface of the interlevel dielectric and a sidewall surface of the gate electrode.

2. The transistor as recited in claim 1, wherein the source/drain region and gate conductor are exposed.

3. The transistor as recited in claim 1, further comprising a spacer adjacent a sidewall surface of the gate conductor, wherein the source/drain region is spaced from a sidewall surface of the gate conductor by the spacer.

4. The transistor as recited in claim 1, wherein the gate dielectric comprises a material selected from the group consisting of barium strontium titanate, lead lanthanum zirconate titanate, barium zirconate titanate, cerium oxide, tin oxide, and tantalum oxide.

5. The transistor as recited in claim 1, wherein the gate dielectric is substantially thicker than approximately 500 angstroms.

6. A transistor arranged within an opening in an interlevel dielectric, the transistor comprising:
- a gate conductor arranged above a channel area within a semiconductor substrate;
- a gate oxide arranged between the gate conductor and the channel area, the gate oxide having a dielectric constant greater than approximately 3.8;
- a pair of spacers arranged adjacent to sidewall surfaces of the gate conductor; and
- a pair of source/drain regions configured within the semiconductor substrate on opposite sides of the gate electrode, wherein each of the pair of source/drain regions is arranged laterally between a sidewall surface of the interlevel dielectric and a sidewall surface of the gate electrode.

7. The transistor as recited in claim 6, wherein the pair of spacers are each between approximately 200 and 500 angstroms thick.

8. The transistor as recited in claim 6, further comprising a pair of lightly doped drain regions configured within the semiconductor substrate, each of the pair of lightly doped drain regions being arranged between one of the pair of source/drain regions and the channel area of the semiconductor substrate.

9. The transistor as recited in claim 6, wherein the pair of spacers each comprise a material dissimilar to a material of which the interlevel dielectric is composed.

10. The transistor as recited in claim 9, wherein the spacers comprise a material selected from the group consisting of silicon nitride, silicon dioxide, and silicon oxynitride.

11. The transistor as recited in claim 6, wherein the source/drain regions and the gate conductor are exposed.

12. The transistor as recited in claim 6, wherein the source/drain regions and the gate conductor are covered by a refractory metal layer having a thickness sufficient to fill the opening in the interlevel dielectric.

13. The transistor as recited in claim 6, wherein the upper surface of the refractory metal layer is substantially coplanar with the upper surface of the interlevel dielectric.

14. The transistor as recited in claim 6, further comprising silicide regions arranged above the pair of source/drain regions and the conductive gate structure and below unreacted portions of the refractory metal layer.

* * * * *